(12) United States Patent
Hirai et al.

(10) Patent No.: US 9,196,715 B2
(45) Date of Patent: Nov. 24, 2015

(54) FIELD EFFECT TRANSISTOR WITH CHANNEL CORE MODIFIED TO REDUCE LEAKAGE CURRENT AND METHOD OF FABRICATION

(71) Applicant: Renesas Electronics Corporation, Kawasaki-shi (JP)

(72) Inventors: Tomohiro Hirai, Kawasaki (JP); Shogo Mochizuki, Kawasaki (JP); Toshiharu Nagumo, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 22 days.

(21) Appl. No.: 14/134,694

(22) Filed: Dec. 19, 2013

(65) Prior Publication Data

US 2014/0183451 A1    Jul. 3, 2014

Related U.S. Application Data

(60) Provisional application No. 61/746,999, filed on Dec. 28, 2012.

(51) Int. Cl.

| | |
|---|---|
| *H01L 29/06* | (2006.01) |
| *H01L 29/775* | (2006.01) |
| *H01L 29/66* | (2006.01) |
| *H01L 29/78* | (2006.01) |
| *H01L 29/778* | (2006.01) |
| *B82Y 10/00* | (2011.01) |

(Continued)

(52) U.S. Cl.
CPC .............. *H01L 29/775* (2013.01); *B82Y 10/00* (2013.01); *H01L 29/0649* (2013.01); *H01L 29/66439* (2013.01); *H01L 29/66477* (2013.01); *H01L 29/778* (2013.01); *H01L 29/7848* (2013.01); *H01L 29/78684* (2013.01); *H01L 29/0673* (2013.01); *H01L 29/4958* (2013.01)

(58) Field of Classification Search
CPC ............................ B82Y 10/00; H01L 29/0665
USPC ............................ 257/24, 191, 404; 438/197
See application file for complete search history.

(56) References Cited

U.S. PATENT DOCUMENTS

| | | | |
|---|---|---|---|
| 5,605,855 A * | 2/1997 | Chang et al. .................. | 438/291 |
| 6,996,147 B2 | 2/2006 | Majumda et al. | |
| 7,051,945 B2 | 5/2006 | Empedocles et al. | |

(Continued)

OTHER PUBLICATIONS

Wei Lu, et al., "Nanowire Transistor Performance Limits and Applications", IEEE Transactions on Electron Devices, vol. 55, No. 11, Nov. 2008, pp. 2859-2876.

(Continued)

*Primary Examiner* — Jami M Valentine
(74) *Attorney, Agent, or Firm* — McGinn IP Law Group, PLLC

(57) ABSTRACT

A semiconductor device includes a channel structure formed on a substrate, the channel structure being formed of a semiconductor material. A gate structure covers at least a portion of the surface of the channel structure and is formed of a film of insulation material and a gate electrode. A source structure is connected to one end of the channel structure, and a drain structure is connected to the other end of the channel structure. The channel structure has a non-uniform composition, in a cross-sectional view, that provides a reduction of a leakage current of the semiconductor device relative to a leakage current that would result from a uniform composition.

9 Claims, 7 Drawing Sheets

(51) Int. Cl.
*H01L 29/786* (2006.01)
*H01L 29/49* (2006.01)

(56) References Cited

U.S. PATENT DOCUMENTS

| | | | |
|---|---|---|---|
| 7,064,372 | B2 | 6/2006 | Duan et al. |
| 7,083,104 | B1 | 8/2006 | Empedocles et al. |
| 7,569,941 | B2 | 8/2009 | Majumdar et al. |
| 7,821,061 | B2 | 10/2010 | Jin et al. |
| 7,858,965 | B2 | 12/2010 | Lu et al. |
| 7,906,778 | B2 | 3/2011 | Kobayashi et al. |
| 7,923,310 | B2 | 4/2011 | Crowder et al. |
| 8,063,450 | B2 | 11/2011 | Wernersson et al. |
| 8,173,993 | B2 | 5/2012 | Bangsaruntip et al. |
| 8,232,165 | B2 | 7/2012 | Chidambarrao et al. |
| 8,258,499 | B2 | 9/2012 | Crowder et al. |
| 2006/0052947 | A1* | 3/2006 | Hu .................................. 702/20 |
| 2011/0049473 | A1 | 3/2011 | Chidambarrao et al. |
| 2011/0163297 | A1 | 7/2011 | Crowder et al. |
| 2012/0009749 | A1 | 1/2012 | Tan et al. |

OTHER PUBLICATIONS

S. A. Dayeh, et al. "Advanced Core/Multishell Germanium/Silicon Nanowire Heterostructures: Morphology and Transport", Applied Physics Letters 98, 2011, pp. 1-3.

Lauhon, et al., "Epitaxial Core-Shell and Core-Multishell Nanowire Heterostructures", Department of Chemistry and Chemical Biology , and Division of Engineering and Applied Science, Harvard University, Cambridge, Massachusetts , vol. 420, Nov. 2002, pp. 57-61.

Lining Zhang, "An Oxide/Silicon Core/Shell Nanowire FET" Nanotechnology (IEEE-NANO), 2011, pp. 1-2.

Liz Kalaugher, "Nanowire Transistor Outperform MOSFET's" nanotechweb.org, Mar. 24, 2006, pp. 1-2.

Charles Lieber, "Semiconductor Nanowires: A Platform for Nanoscience and Nanotechnology" Http:/www.negi.nlm.nih.gov/pmc/articles/PMC3375735/, pp. 1-6, Dec. 1, 2011.

* cited by examiner

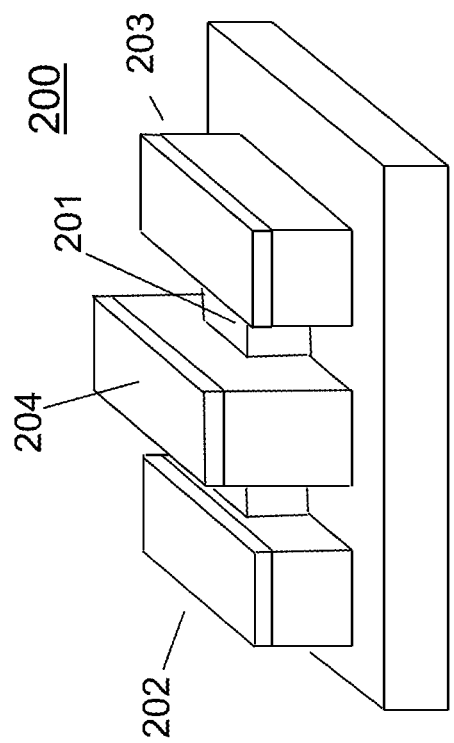
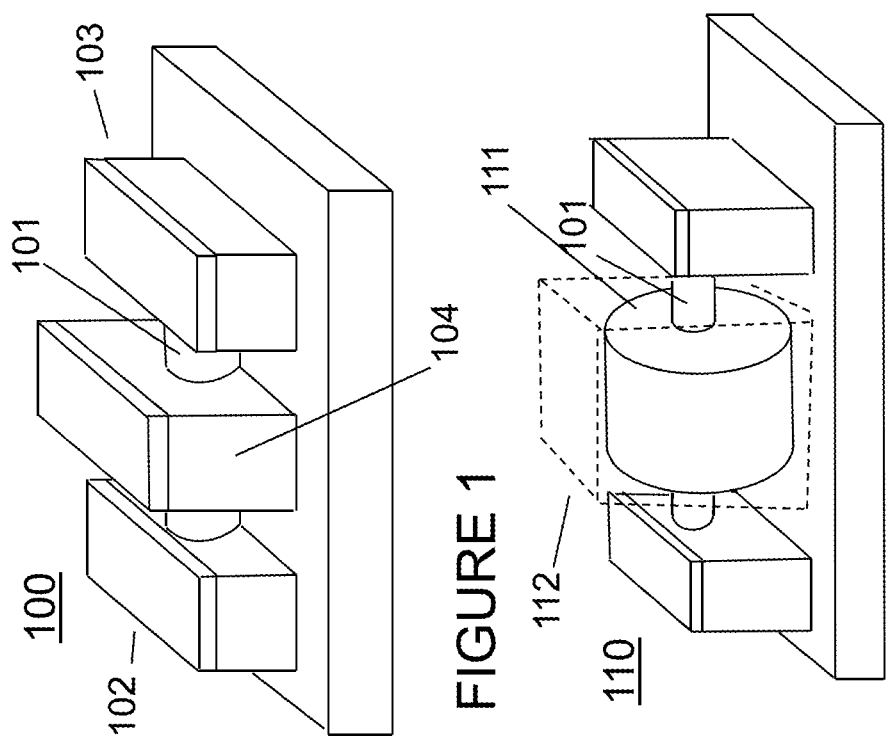

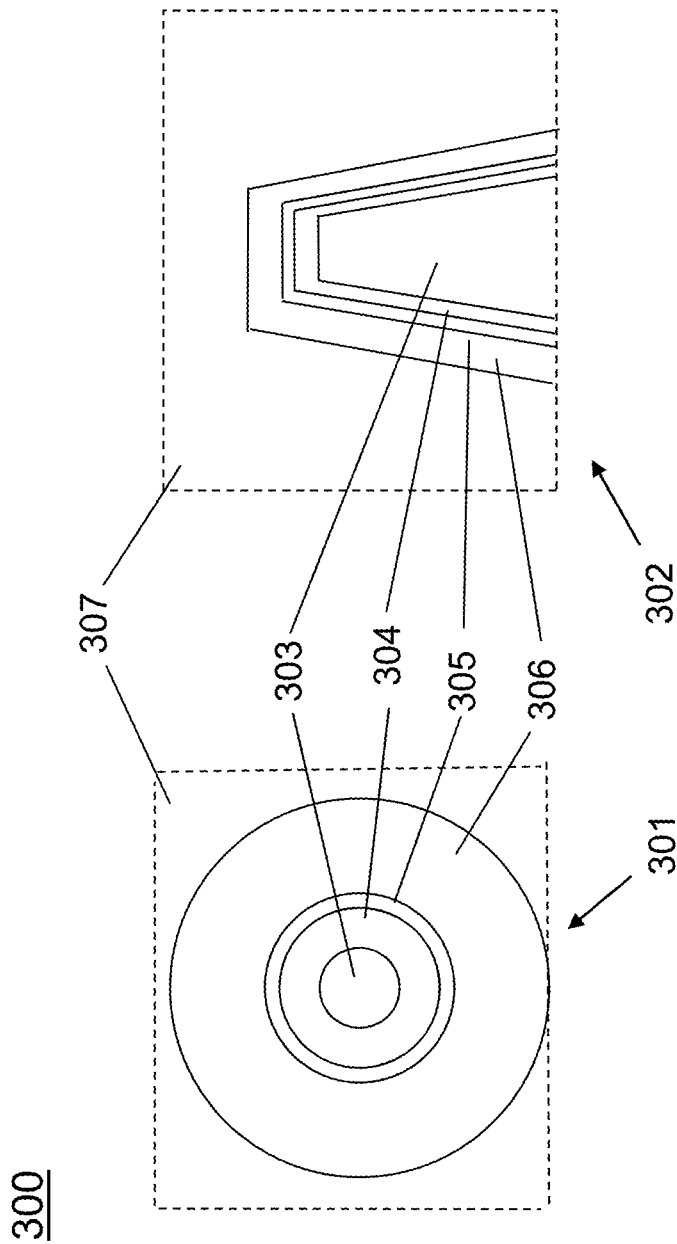

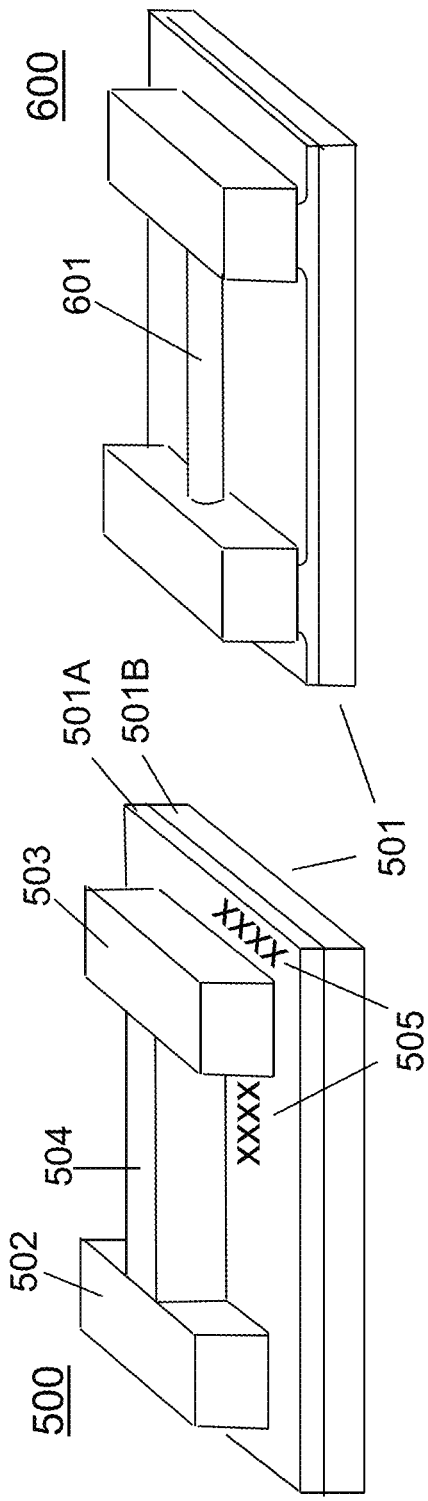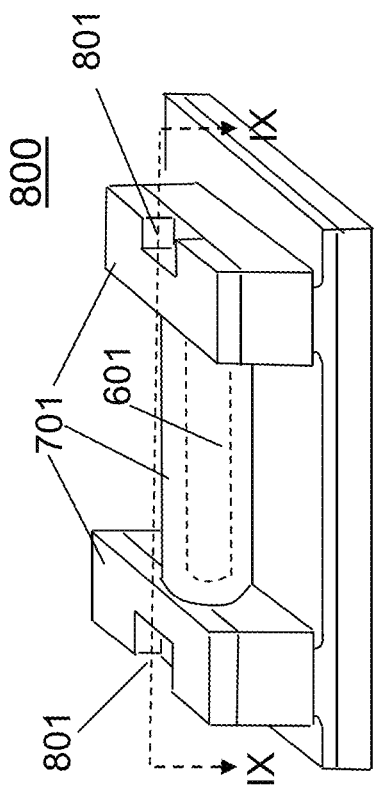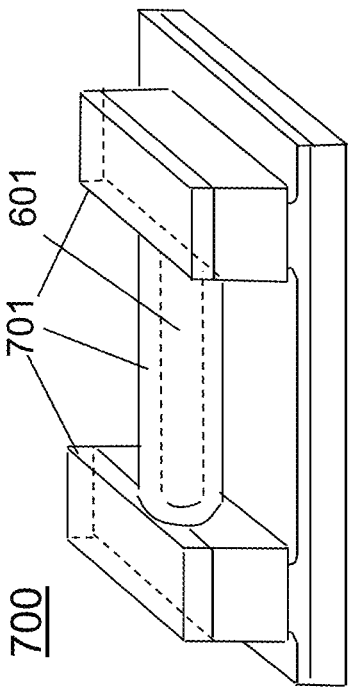

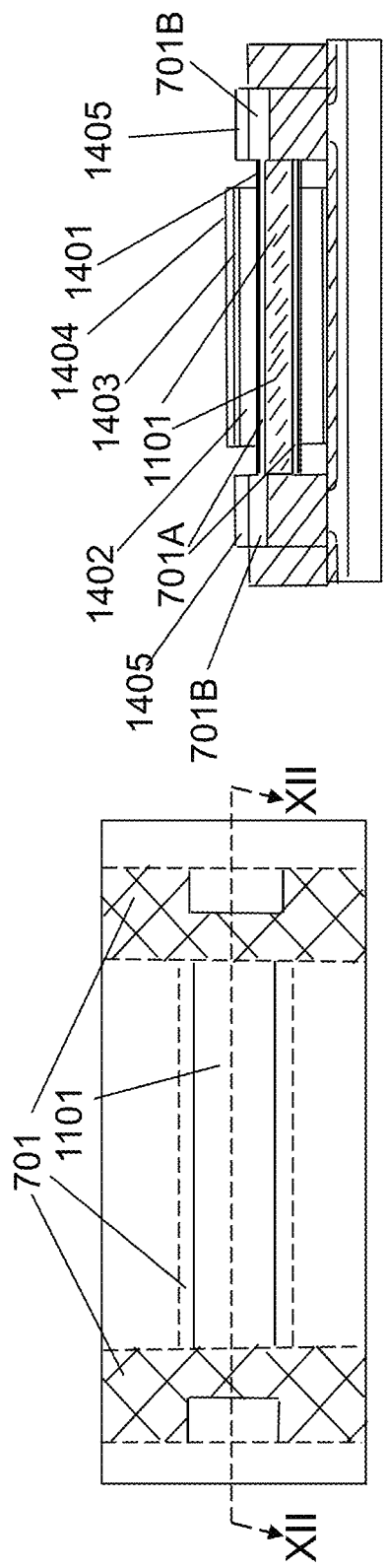

FIELD EFFECT TRANSISTOR WITH CHANNEL CORE MODIFIED TO REDUCE LEAKAGE CURRENT AND METHOD OF FABRICATION

This Application is a Non-provisional Application of Provisional Application No. 61/746,999, filed on Dec. 28, 2012, and claims priority thereto.

BACKGROUND OF THE INVENTION

1. Field of the Invention

The present invention relates generally to a NanoWire Field Effect Transistor (NWFET) or a finFET in which a channel core is modified for reduced leakage current. More specifically, the core of the nanowire channel of the NWFET or the core of the fin of the finFET either has a cavity or the cavity of the core is filled with a dielectric, such as $SiO_2$.

2. Description of the Related Art

A recent trend in integrated circuit (IC) design is the use of nanowire transistors. FIG. 1 shows exemplarily a conventional nanowire field effect transistor (NWFET) configuration 100, wherein the nanowire 101 serves as the channel interconnecting the source 102 and drain 103. The gate 104 serves to control conductivity of the channel nanowire 101.

As shown in FIG. 1A, a gate-all-around nanowire FET 110 has a gate structure 111 that encircles the nanowire 101, as then further covered by a doped polysilicon structure 112. An example of a gate-all-around nanowire FET is described in U.S. Pat. No. 8,173,993 to Bangsaruntip, et al., the contents of which is incorporated herein by reference.

FIG. 2 shows exemplarily a conventional finFET 200, wherein the fin 201 serves as the channel interconnecting the source 202 and drain 203, with gate 204 serving to control the channel conductivity. Unlike the fin of the finFET, the nanowire channel of the NWFET 100 is typically roughly circular in cross-sectional view and is typically supported to be above the substrate, as exemplarily shown in FIG. 1A.

Concurrent with the miniaturization of electronic devices, as exemplified by the use of NWFETs and finFETs is a requirement for reduction of power consumption, including a reduction in the leakage current Ioff.

SUMMARY OF THE INVENTION

In view of the foregoing and other exemplary problems, drawbacks, and disadvantages of the conventional methods and systems, an exemplary feature of the present invention is to provide structure and method of fabrication of NWFETs and finFETs having reduced power consumption.

In a first exemplary aspect of the present invention, described herein is semiconductor device, including: a channel structure formed on a substrate, the channel structure comprising a semiconductor material; a gate structure covering at least a portion of a surface of the channel structure, the gate structure comprising a film of insulation material and a gate electrode; a source structure connected to one end of the channel structure; and a drain structure connected to the other end of the channel structure, wherein the channel structure has a non-uniform composition, in a cross-sectional view, that provides a reduction of a leakage current of the semiconductor device relative to a leakage current that would result from a uniform composition.

In a second exemplary aspect, also described herein is a method of fabricating a semiconductor device with a reduced leakage current, including: forming a channel structure on a substrate, the channel structure having a non-uniform composition, in a cross-sectional view, that comprises a core region and a peripheral region, an etch rate of the core region differing from an etch rate of the peripheral region; forming a source structure connected to one end of the channel structure; forming a drain structure connected to the other end of the channel structure; selectively etching at least a portion of the core region; and forming a gate structure to cover at least a portion of a surface of the channel structure, the gate structure comprising a film of insulation material and a gate electrode.

Other aspects, features and advantages of the invention will be more fully apparent from the ensuing disclosure and appended claims.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1 exemplarily shows a conventional NWFET 100;

FIG. 1A exemplarily shows a conventional NWFET with gate structure 111 encircling the nanowire 101 to provide a gate-all-around configuration 110;

FIG. 2 exemplarily shows a conventional finFET 200;

FIG. 3 illustrates a cross-sectional view 300 of a nanowire structure 301 and fin structure 302 of exemplary embodiments of the present invention, demonstrating the dielectric core 303;

FIG. 5 illustrates an initial fabrication stage 500 of the present invention;

FIG. 6 illustrates the nanowire formation stage 600 of an exemplary embodiment of the present invention;

FIG. 7 illustrates a fabrication stage 700 in which a channel layer 701 is deposited on a nanowire 601 and the source/drain regions;

FIG. 8 illustrates a fabrication stage 800 in which portions 801 of the source/drain regions are etched to form an opening to the underlying layer so that the nanowire core can be etched out;

FIG. 13 shows a plan view 1300 of the fabrication step shown in FIG. 12; and

FIG. 14 illustrates a final fabrication stage 1400 showing the formation of a gate structure;

DETAILED DESCRIPTION OF EXEMPLARY EMBODIMENTS OF THE INVENTION

Figure 4:
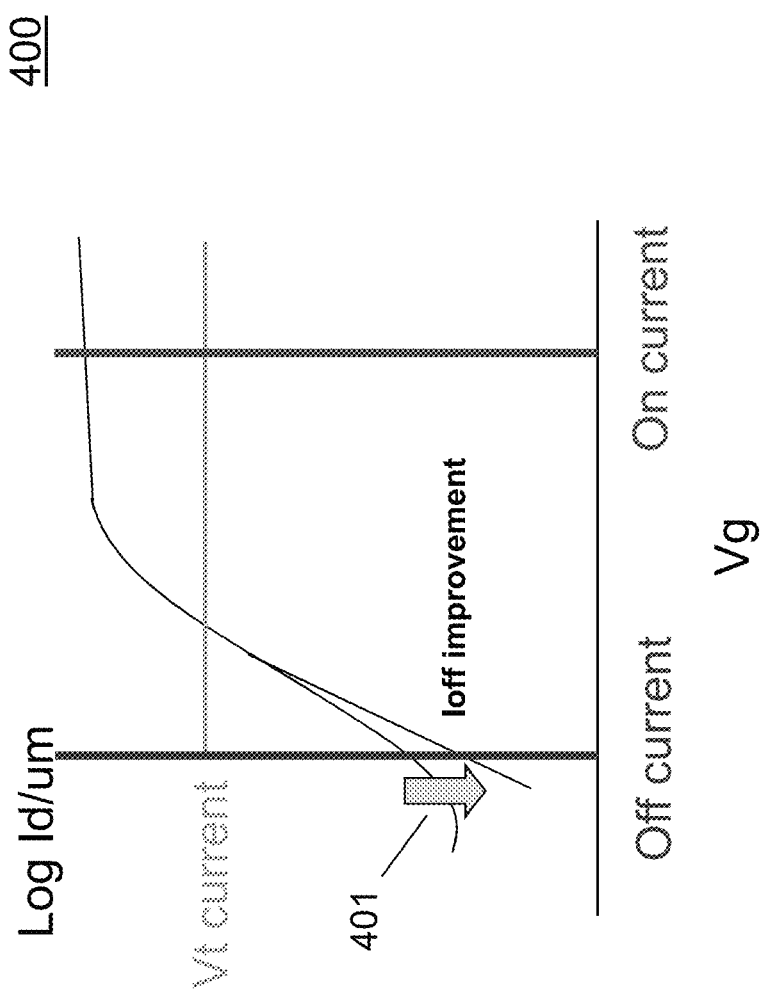
FIG. 4 provides an exemplary characteristic curve 400 that demonstrates the improvement of leakage current provided by the present invention.

Referring now to the drawings, and more particularly to FIGS. 3-15, exemplary embodiments of the method and structures of the present invention will now be explained.

To begin, FIG. 3 exemplarily illustrates a cross-sectional view 300 of a nanowire channel 301 of an NWFET or fin 302 of a finFET of the present invention, as modified to incorporate a high-K dielectric material, such as $SiO_2$, as used herein to explain an exemplary embodiment of the present invention. However, any dielectric material that can be inserted into a nanowire could be substituted, including dielectrics well known in the art, such SiN, $TiO_2$, $HfO_2$, $ZrO_2$, but this listing is intended to be non-limiting, as a core 303 of a channel 304, surrounded by a gate dielectric layer 305, which, in turn, is surrounded by the gate structure including, for example, a layer of metal 306 and a layer of doped polysilicon 307. As typical with conventional nanowire channel devices, the channel 304 would typically be comprised of Si, SiGe, or Si/SiGe.

The present inventors have realized that leakage current of the conventional NWFET or finFET can be desirably reduced by recognizing that the conventional devices incorporate a solid semiconductor core that serves as the device channel In accordance with an exemplary aspect of the present invention, the device leakage current is reduced in the present invention by incorporating a center dielectric core inside the channel core of the NWFET or finFET. This dielectric core can achieve an effect of reducing leakage current Ioff to provide the device characteristic curve 400 exemplarily illustrated in FIG. 4.

As exemplarily shown in the device characteristic curve 400 in FIG. 4, the improved gate electrostatic characteristic of the present invention provides an improvement 401 of Ioff, as shown by the downward-pointing arrow. The horizontal axis is gate voltage Vg and the vertical axis is the logarithmic scale for current per micrometer length of the channel length (Id/μm). Threshold voltage Vt is not affected by the center dielectric core.

On one level, the present invention can be considered as providing a nanowire (or fin) device in which the core of the nanowire has been modified to improve the gate electrostatic characteristic. In an exemplary embodiment, the core has been replaced by a dielectric material. Since this dielectric core takes up space inside the channel region, there is less space in the channel for carriers so that there is better electrostatic control of the gate electrode. Keeping electrons and/or holes under the electrostatic control of the gate electrode is key to controlling leakage current, and the thinner the channel thickness is, the better the gate electrostatic becomes.

As an alternative exemplary embodiment, the channel core could also be left as a cavity rather than filling the cavity with dielectric material, thereby providing an alternate mechanism to reduce the effect of a solid core channel Therefore, the exemplary embodiment 300 of FIG. 3 could also demonstrate a channel having an internal cavity 303 rather than a center dielectric core 303.

FIGS. 5-14 demonstrate exemplary fabrication steps for a device implementing the concepts of the present invention, as shown for an NWFET. One having ordinary skill in the art would recognize that the fabrication of a finFET would have correspondingly similar fabrication steps, with the fin of the finFET being operated on in a similar manner as described below for an NWFET, so these fabrication steps should be considered as additionally demonstrating the fabrication steps of a finFET except that the nanowire modifications would correspond to similar modifications of the fin structure.

In a fabrication stage 500 shown exemplarily in FIG. 5, a first base portion 502, a second base portion 503, and a third base portion 504 are formed on a substrate 501 using, for example, a deposition of Si, SiGe, or Si/SiGe. The substrate 501 itself is not critical and could be any conventional substrate, including, for example, a silicon wafer or a silicon-on-insulator (SOI) structure exemplarily shown in FIG. 5, wherein the upper layer 501A comprises a buried oxide (BOX) layer on top of the silicon layer 501B. The first and second base portions 502, 503 will ultimately serve as the source and drain for the device and the third base portion 504 will serve as the basis for the core of the device channel.

In an exemplary fabrication method of the present invention and as will be clear from the following description, selective etching will be used to selectively remove portions of the device during fabrication, exemplarily using a wet etching or RIE (reactive-ion etching), including being able to selectively etch out the core of the nanowire from the ends of the core. Accordingly, the selection of materials for the substrate and the base portions will require consideration of achieving different etching characteristics, so that material depositions will be designed to achieve the structure described herein.

As a non-limiting example, since the core of the nanowire is to be etched to leave behind the surrounding channel portion, a possible combination of channel/core materials would be $Si(1-x)Ge(x)/Si(1-y)Ge(y)$, where x, y are atomic %. The channel could be Si70%Ge30% and the core could be Si50%Ge50%, since, generally speaking, the higher Ge concentration means the faster the RIE rate.

Another factor to consider in material deposition is the doping of the deposited materials, since different doping could assist in getting different wet RIE rates. Additionally, doping could be used to achieve different threshold voltages Vt.

One of ordinary skill in the art will be able to select specific material compositions and doping once the remaining structure and fabrication is explained in the following discussion.

In the exemplary embodiment used for describing the present invention, the material exemplarily used for the first, second, and third base portions 502, 503, 504 is SiGe, since portions of this material will be subsequently selectively etched away, including etching of the third base portion from its two ends.

In the fabrication stage 600 shown in FIG. 6, the third base portion 504 and an underlying portion 505 of the BOX layer 501A are etched to provide a free-standing nanowire 601 supported on each end by the first and second base portions 502,503. Such etching could use, for example, diluted hydrofluoric acid (DHF). If desired, the resultant nanowire 601 can be smoothed by annealing the nanowire structure 601 in a hydrogen atmosphere, as described in the above-mentioned '993 patent, so that the nanowire 601 is substantially circular in cross section, but such circular cross section is not critical to the present invention.

That is, the nanowire could have other cross-sectional shapes based upon the treatment of the third base portion 504 based on the amount of etching and the initial dimensions of the base portion 504. If the base portion 504 has approximately equal dimensions for height and width, and a smoothing step is included, then the resultant nanowire could be substantially circular in cross section. The smoothing could be achieved by, for example, an annealing process in hydrogen. If the base portion 504 has substantially different height/width dimensions, the cross-sectional shape would be more oval. If no smoothing procedure is used, the cross-sectional shape would be more irregular.

In the fabrication stage 700 shown in FIG. 7, a film 701 of semiconductor material, such as silicon, is now deposited over the first and second base portions 502,503 and the nanowire 601, thereby increasing the diameter of the nanowire 601. Based on the above comment that higher Ge content will etch faster, it is noted that Si is exemplarily used in this discussion because it has a slower etch rate compared to SiGe, so that the third base portion 504 can be selectively etched out from its two ends to thereby form a channel structure of Si with a hollow core.

In the fabrication stage 800 shown in FIG. 8, an opening 801 in the Si layer of each of the first and second base portions, to expose the underlying SiGe layer 502, 503 at each end of the nanowire structure. Thus, this opening provides an etchant access to the underlying SiGe layer that will more readily etch than the Si layer 701. It is noted that the dashed line labeled IX in FIG. 8 indicates the cross-sectional view shown in FIG. 9 and is presented in FIG. 8 to show the relationship between these two figures.

Figure 9:
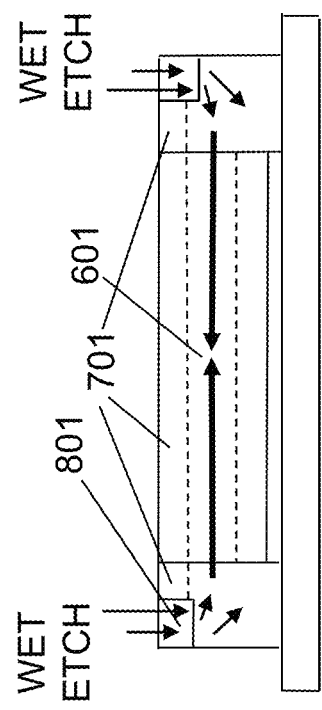
FIG. 9 illustrates a fabrication stage 900 in which core 601 in the nanowire structure is etched out by a wet etching process, from the two ends of the nanowire structure.

In fabrication stage 900 shown in FIG. 9, a wet etching is performed, to selectively etch away the SiGe at the openings of the first and second base portions and continuing into the SiGe core 601 of the nanowire structure, thereby removing the SiGe nanowire core via the two ends of the nanowire structure.

Figure 10:
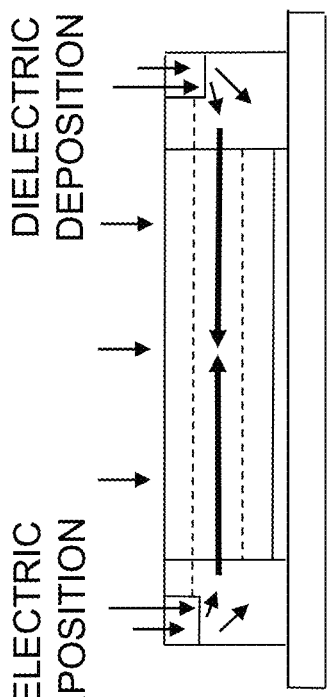
FIG. 10 illustrates a fabrication stage 1000 in which a dielectric D is deposited into the etched cavity to form a dielectric core for the nanowire structure.

In fabrication stage 1000 shown in FIG. 10, dielectric material D is deposited into the nanowire core, using, for example, an epitaxial deposition of $SiO_2$ or other desired dielectric material.

Figure 11:
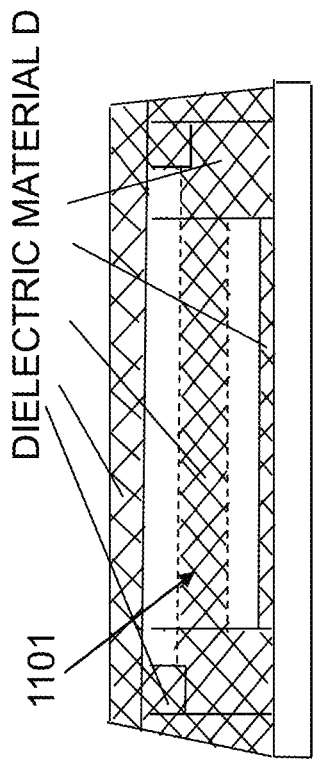
FIG. 11 shows a cross sectional view 1100 after the dielectric deposition.

FIG. 11 shows the cross-sectional view 1100 through the longitudinal centerline of the device upon completion of the deposition of dielectric material D. The crosshatching shows the portions of the device that comprise dielectric material D. It is noted that the nanowire structure now has a center core 1101 of dielectric material D.

Figure 12:
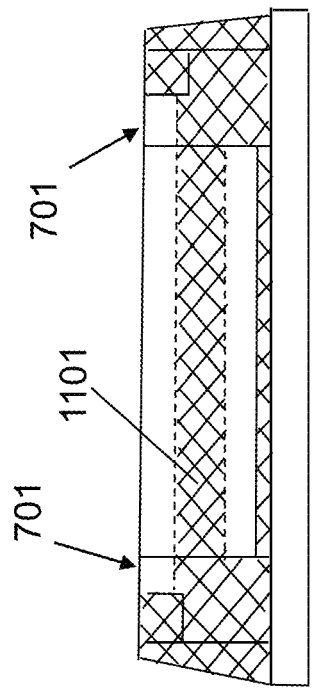
FIG. 12 shows a fabrication stage 1200 in which the source/drain portions 701 are exposed by polishing.

FIG. 12 shows the cross-sectional view 1200 when the dielectric material D has been polished down to expose the upper surface 701 of the source/drain regions, using, for example, a CMP (chemical-mechanical polishing). This step levels the deposited dielectric layer and exposes the underlying Si layer. The Si layer that will serve as the channel is the unhatched portions above and below the dielectric center core 1101.

FIG. 13 shows a plan view 1300 of this stage of fabrication, using hatched portions to show the exposed Si areas 701 that will serve as source/drain portions. Depending upon the relative height of the nanowire structure, the upper portion 701 of the channel Si layer might also be exposed. The dielectric core 1101 is shown for reference, but this dielectric core 1100 would not be exposed by the CMP process. It is noted that the dashed line labeled XII of FIG. 13 indicates the cross-sectional view shown in FIG. 12 and is added to FIG. 13 to relate back to FIG. 12.

In the fabrication stage 1400 shown in FIG. 14, a gate structure is then formed, using a sequence well known in the art in which the gate region is isolated by lithography so that the dielectric around the nanowire structure can be etched away down to the substrate, and then depositing in sequence first a first insulating film 1401, such as SiO2, to surround the channel layer 701A and serve as the gate dielectric layer, followed by formation of one or more gate films 1402, 1403, such as by deposition of amorphous silicon or a metal such as aluminum, around the gate dielectric layer. Contacts can then be formed for the gate (e.g., 1404) and the source/drain (e.g., 1405) on the Si layer 701B.

Figure 15:
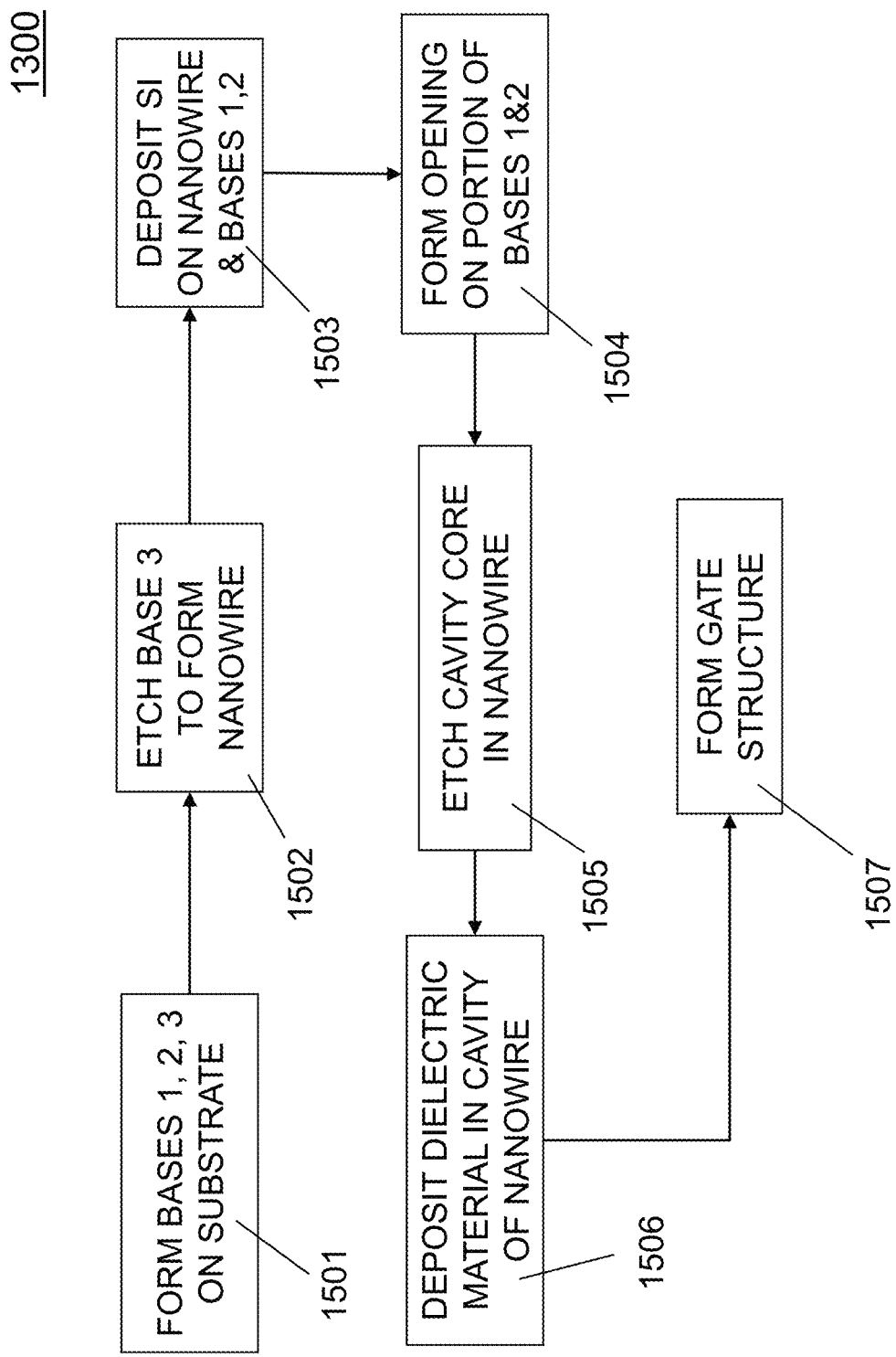
FIG. 15 provides a simplified flowchart 1500 of key steps in the fabrication of a device described in the present invention.

FIG. 15 is a flowchart 1500 that summarizes the fabrication sequence described above, particularly relative to the novel aspects of forming a nanowire core that affects the leakage current of the device by, for example, either depositing a dielectric material to form a nanowire dielectric core or by leaving the nanowire core as an etched-out cavity.

While the invention has been described in terms of several exemplary embodiments, those skilled in the art will recognize that the invention can be practiced with modifications. As examples of possible modifications, it is again noted that a finFET could be fabricated using the same fabrication steps described above for the nanowire. Other possible modifications include using a plurality of different nanowires interconnected between the first and second base portions, the plurality of nanowires having the same gate structure so that the gate simultaneously controls all of the nanowire channels. Further, it is noted that, Applicant's intent is to encompass equivalents of all claim elements, even if amended later during prosecution.

What is claimed is:

1. A semiconductor device, comprising:
   a channel structure formed on a substrate, the channel structure comprising a semiconductor material;
   a gate structure covering at least a portion of a surface of the channel structure, the gate structure comprising a film of insulation material and a gate electrode;
   a source structure connected to one end of the channel structure; and
   a drain structure connected to the other end of the channel structure,
   wherein the channel structure has a non-uniform composition, in a cross-sectional view, that provides a reduction of a leakage current of the semiconductor device relative to a leakage current that would result from a uniform composition, the non-uniform composition of the channel structure comprising one of:
      a cavity formed longitudinally in the semiconductor material forming the channel structure, the cavity thereby providing the reduction of the leakage current; and
      a center core comprising a dielectric material, the dielectric center core thereby providing the reduction of the leakage current.

2. The semiconductor device of claim 1, wherein the dielectric material of the center core comprises $SiO_2$.

3. The semiconductor device of claim 1, wherein the dielectric material of the center core comprises at least one of SiN, $TiO_2$, $HfO_2$, and $ZrO_2$.

4. The semiconductor device of claim 1, wherein said film comprises a first film of insulation material, said semiconductor device further comprising:
   a second film of insulation material, the second film having openings respectively over the source structure, the drain structure, and the gate structure; and
   a conductive material that respectively fills the openings to respectively contact the source structure, the drain structure, and the gate structure, and that respectively comprise electrical connections for the semiconductor device.

5. The semiconductor device of claim 1, wherein the channel structure comprises a nanowire, the semiconductor device thereby comprising a nanowire field effect transistor (NWFET).

6. The semiconductor device of claim 1, wherein the channel structure comprises a fin structure, the semiconductor device thereby a finFET (fin field effect transistor).

7. The semiconductor device of claim 1, wherein the semiconductor material of the channel structure comprises silicon, the source and drain structures comprise SiGe, and the gate insulation film comprises $SiO_2$.

8. The semiconductor device of claim 1, wherein the channel structure interconnecting the source and drain structures comprises a plurality of interconnecting structures, each having the cross-sectional non-uniform composition to reduce said leakage current.

9. A chip comprising at least one semiconductor device of claim 1.